United States Patent [19]

Anticole

[11] Patent Number: 5,600,575
[45] Date of Patent: Feb. 4, 1997

[54] DRIVE PROTECTION MONITOR FOR MOTOR AND AMPLIFIER

[76] Inventor: Robert B. Anticole, 19 Commons Dr., Bradfordwoods, Pa. 15015

[21] Appl. No.: 317,677

[22] Filed: Oct. 5, 1994

[51] Int. Cl.⁶ .................. H03F 3/21; H02H 7/00
[52] U.S. Cl. ........................ 364/557; 330/146
[58] Field of Search .................. 361/103, 106, 361/25, 27, 18, 24, 31, 93; 318/434, 471, 681, 566, 635, 678, 679; 327/512; 388/934, 903, 910; 364/557; 323/907, 316; 330/289, 297, 298, 207 P, 250, 146, 252, 262, 265, 263; 374/178

[56] References Cited

U.S. PATENT DOCUMENTS

| | | | |
|---|---|---|---|
| 3,600,650 | 8/1971 | Obenhaus et al. | 317/235 R |
| 3,990,020 | 11/1976 | Porter, III | 330/207 P |
| 4,001,649 | 2/1977 | Young | 317/41 |
| 4,547,826 | 10/1985 | Premerlani | 361/25 |
| 5,225,992 | 7/1993 | Kobari et al. | 364/483 |

Primary Examiner—Edward R. Cosimano
Assistant Examiner—Tony M. Cole
Attorney, Agent, or Firm— Webb Ziesenheim Bruening Logsdon, Orkin & Hanson, P.C.

[57] ABSTRACT

An apparatus for monitoring the temperature of an inaccessible portion of an electrical current carrying device that cannot be directly measured easily comprises circuits for establishing a reference temperature value in the vicinity of the current carrying device and measuring the power dissipated in the current carrying device, a digital computer having ports for inputting the reference temperature value, the power dissipated in the current carrying device, the thermal resistances and thermal time constants of the thermal model simulating the current carrying device to the reference temperature, and a program stored in the digital computer for continuously calculating a differential temperature based upon the power dissipation and thermal model and adding the reference temperature thereto.

19 Claims, 13 Drawing Sheets

DRIVE PROTECTION MONITOR FOR MOTOR AND AMPLIFIER

FIELD OF THE INVENTION

This invention relates to a method and apparatus of protecting an electric motor and the power amplifier which provides power to the motor by continuously monitoring important parameters that affect the reliability of the amplifier and motor.

DISCUSSION OF PRIOR ART

In the past, power semiconductors in power amplifiers have been protected from over temperature conditions by a thermostat mounted on the heat sink to which the transistors are attached. Other methods of protection included use of a simple thermal model. Further methods of protection included manufacturing the semiconductor with a built-in temperature sensor. All these methods protect the semiconductors by shutting the system down when over temperatures are reached because operation above the recommended temperatures reduces the life of the semiconductors. The heat sink mounted thermostat is not able to provide a reliable indication of the critical junction temperature because of the large differences in thermal time constants of the semiconductor and heat sink. The simple analog thermal model disclosed in U.S. Pat. No. 4,001,649 ignores the case to sink interface and only measures current to estimate the power being dissipated in the semiconductor, resulting in low accuracy. A built-in temperature sensor is costly, lacks coordination with other protection, does not allow for user set point selection, and does not provide a continuous indication of the semiconductor device temperature. These methods do not contain multiple set point capability to initiate the various protection actions discussed herein.

Previous over temperature protection methods for motors that have rotating windings used thermostats on the motor housing to sense temperature. These are not able to provide a reliable indication of the critical winding temperature because of the large differences in thermal time constants of the rotating winding and housing. Motors that had stationary windings into which a thermostat or thermistor could be embedded, lacked the multiple user-selectable set points to initiate cooling, warning, foldback or shutdown; were not able to provide a continuous indication of temperature; and were not able to monitor the temperature of the rotating member.

The protection techniques disclosed in U.S. Pat. Nos. 4,547,826 and 5,225,992 ignore the substantial effect that motor temperature has on the heating process by failing to recognize increased power dissipation in the motor when temperature increases winding ohmic resistance. These over temperature protection techniques also do not contain multiple thermal time constant models or include consideration of speed dependent heating losses.

Fusing motors and amplifiers are popular prior art protection mechanisms, but fuses are one-time elements that are destroyed in the protection process, require manual replacement, require a specific fuse for each desired blowing current versus time profile, do not warn of approach to the interrupt level, cannot control current to prevent interruption when desired, and do not notify the user when blown. Circuit breakers function as fuses and are not destroyed in the protection process, but circuit breakers have large tolerances that cause the blowing time to vary by as much as a factor of ten in the mid-range blowing current regions.

Mechanical revolution counters have been employed to indicate when motor brushes need to be replaced, or when bearings need maintenance. These methods require the addition of extra parts. The counters also lack means to "weight" the revolutions such as assigning a brush wear factor that counts more revolutions at higher currents and speeds where brush wear is higher per mechanical revolution.

Brush life of motors can be reduced considerably when commutation limits are ignored. Implementing commutation limits for brush-type motors required a tachometer to measure motor speed, or was not able to implement an accurate commutation limit because the motor speed was not known accurately.

Power sharing in linear bridge amplifiers is necessary to use the full power dissipation capability of the output semiconductors. Many applications operate better when the amplifier controls output current instead of controlling output voltage. The prior art requires matched or precision resistors with temperature tracking of the critical divider ratios to maintain stability with current feedback loops, requires dual supplies, or does not maintain power sharing when the supply voltage drops such as in U.S. Pat. No. 3,990,020.

SUMMARY OF THE INVENTION

Accordingly, several objects and advantages of my invention are the protection of the power amplifier semiconductors by continuously and accurately calculating their junction temperatures and initiating cooling, warning, foldback or shutdown according to preprogrammed selectable set points.

It is another object of the invention to provide an accurate calculation of the temperature of rotating motor windings. These temperatures will be available to initiate cooling, warning, foldback or shutdown according to preprogrammed set points; these latter benefits will also be available on windings that do not rotate.

It is still another object of the invention to provide fusing that has programmable blowing current and time constant, which never needs to be replaced, which can be reset electronically, which warns when the current level has reached a set point value, which can reduce current when desired, which notifies when the fuse has been blown, and which provides an accurate blowing current and time constant.

Another object of the invention is to monitor motor or bearing revolutions as a maintenance tool that warns when set points have been reached and shuts down when the maximum set point is reached. The revolution monitor will require no additional mechanical hardware and will be able to produce "weighted" revolutions.

It is also an object of the invention to implement commutation limits for brush-type motors to protect the motors and prolong brush life without the need for adding a tachometer or other speed sensing mechanisms.

It is a further object of the invention to provide power sharing for linear bridge amplifiers in a current feedback mode that provides power sharing with unregulated power supplies and without the need for precision temperature-tracking components or dual high power supplies.

The drive protection monitor, according to this invention, is implemented, in part, by a programmed microprocessor, microcontroller or the like. The sensed inputs are converted to digital signal values and these values are processed to calculate critical temperatures, e.g., semiconductor junction temperatures and motor winding temperatures.

Accordingly, there is provided an apparatus for monitoring the temperature of an inaccessible portion of an electrical current carrying device that cannot be directly measured easily. The apparatus comprises a sensor for detecting a reference temperature value in the vicinity of the current carrying device. It further comprises a sensor or sensors for measuring the power dissipated in the current carrying device. An electronic computer (microcontroller, microprocessor, digital signal processor, etc.) is provided with connections for inputting to the computer the reference temperature value and the power dissipated in the current carrying device. The computer also is provided with means for storing thermal resistances and thermal time constants of a thermal model simulating the current carrying device to the reference temperature. The computer has stored therein a program for continuously calculating a differential temperature based upon the power dissipation and the thermal model and adding the differential temperature to the reference temperature.

Preferably, the reference temperature is continuously measured (e.g., with a thermistor) in the vicinity of the electrical current carrying device.

According to one embodiment, the computer is programmed to calculate the power dissipation in the current carrying device, which is used in calculating the differential temperature, by multiplying the current by the voltage drop across the device or by multiplying the current squared by a resistance to obtain power dissipation, where said resistance may be a function of the current or temperature. The differential temperature is calculated by periodically solving a Difference Equation representing the thermal model with inputs of the present power dissipated and the past differential temperature.

According to a preferred embodiment, the computer is programmed to provide a fuse shutdown.

In a still further preferred embodiment, a calculated temperature is compared to preprogrammed limits that activate cooling action, annunciation, foldback or shutdown.

The current carrying device may be an output semiconductor (transistor, FET, SCR, etc.) in a power amplifier, the critical temperature of which is calculated, is a PN (NPN, PNP, etc.) junction. The current carrying device may be a winding in an electrical motor.

According to a preferred embodiment, the computer is programmed for measuring the rotational speed of the motor by measuring the voltage across the motor; by calculating the IR drop across the motor by multiplying the electrical current by the ohmic resistance adjusted for temperature as that temperature was calculated in a previous step; and by calculating the back emf of the motor by subtracting the calculated IR drop from the measured motor voltage and calculating the speed by comparing the back emf to an established relationship between motor speed and back emf. The program may further integrate the calculated speed over time to record motor revolutions. The program may further use the calculated rotational speed to limit current in a way to reduce the brush wear in a mechanically commutated motor. The program may further use the calculated rotational speed to calculate the speed dependent rotational losses which add to the power dissipated in the motor. The program may still further use the calculated rotational speed to update thermal resistances and thermal time constants that are affected by motor rotational speed.

According to yet another preferred embodiment, the current carrying device comprises a bridge amplifier with power sharing control. A bridge amplifier comprises four output semiconductors connected in first and second pairs series connected between the power bus and ground. The output of the transistor bridge is across the junctions between the semiconductors of the first and second semiconductor pairs. A first driver circuit controls the semiconductors in one pair to connect the output common thereto towards either the power bus or ground and to control current in the one conducting semiconductor in that pair. A second driver circuit controls the semiconductors in the other semiconductor pair such that the voltage across the conducting transistor of one pair substantially equals the voltage across the conducting transistor on the other pair, regardless of power supply variations. In this way, the voltage drop across the conducting semiconductors remains substantially equal and the power dissipation therein is also substantially equal.

BRIEF DESCRIPTION OF THE DRAWINGS

Further objects and advantages of my invention will become apparent from a consideration of the drawings and ensuing description.

DESCRIPTION OF THE PREFERRED EMBODIMENTS

Power Sharing:

Before the temperature control of the power transistors in a bridge circuit can be effected for a bridge circuit containing four power transistors (two of which conduct at any one time), it is preferable that the two conducting transistors substantially equally share power dissipation. Otherwise, one transistor could be overloaded while the other transistor is still at a safe temperature.

Figure 1:
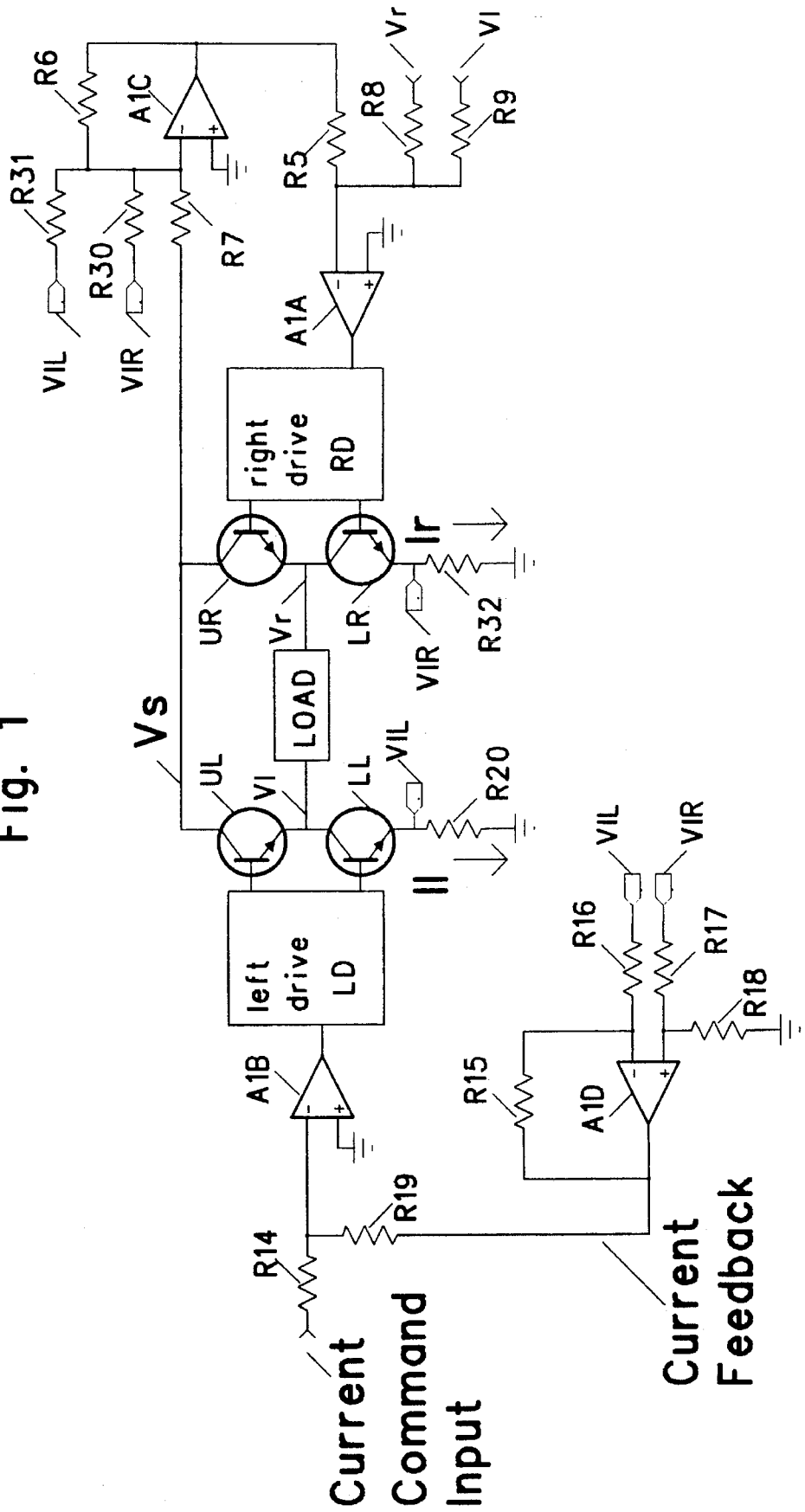
FIG. 1 is a simplified schematic of a power sharing bridge amplifier connected to a load.

Referring to FIG. 1, the preferred embodiment comprises a linear bridge power amplifier. As with any bridge amplifier, the direction of current through the load may be changed by reversing the polarity of the voltage across the load. As shown in FIG. 1, the bridge amplifier comprises a left pair of series connected power transistors and a right pair of series connected power transistors. The load is connected between the junctions of both pairs. The four transistors have been labeled UL, LL, UR and LR for upper left, lower left, upper right and lower right. The upper and lower transistors on each side of the bridge are controlled by drives LD and RD so as to never conduct simultaneously since this would result in shorting the single high power bus voltage Vs to ground.

Between the lower transistor on each side of the bridge and ground is a small sense resistor to detect a current feedback signal, labeled R20 and R32. The feedback signals, VIL and VIR, both of which must always be a positive voltage, are subtracted by an operational amplifier (OP AMP) A1D such that the output of the OP AMP is indicative of the polarity of the current flowing in the load and the magnitude of the current flowing in the load.

The current feedback signal output from the OP AMP A1D is summed with a command signal and input to the OP AMP A1B. The polarity of the current command signal determines the direction of current flowing through the load. For example, the negative current command causes the upper left transistor to conduct and causes the current to flow in the load from left to right. The left side of the bridge is controlled directly by the current command and current feedback signals through the action of the left drive LD.

The right side of the bridge responds to effect power sharing. When the transistor UL is conducting, so also must the transistor LR. The current in the conducting transistors is the same and the voltage across each conducting transistor must be the same to achieve power sharing. The input to the right drive RD is a signal which effects the power sharing, that is, causes the voltage drop across LR to be the same as the voltage drop across UL at all times. This condition is satisfied by the condition Vr=Vs−Vl (Vr and Vl equal output voltages of the right and left sides of the bridge, respectively).

The supply voltage Vs is input to OP AMP A1C through resistor R7 (the other inputs to be explained later). The voltage at the output of OP AMP A1C is −Vs/5 because R7 is five times greater than R6. The output of OP AMP A1C is then added to the left and right output voltages Vr and Vl in A1A to provide a command signal to the right side of the bridge. Vr is the feedback voltage being controlled. R5 is ⅕ the value of R8 and R9; R8 and R9 are the same value of resistance. The output of the right side of the bridge in response to the inputs to A1A is Vr=−5(−Vs/5)−Vl=Vs−Vl, which is the desired result for sharing.

A correction is necessary for current feedback amplifiers when current sense resistors R20 and R32 are used to sense current for feedback. The voltages VIL and VIR across R20 and R32 unbalance the voltage sharing because the Vl and Vr voltages fed back represent the voltage across the lower conducting transistor plus VIL or VIR. Accurate power sharing can be regained by adding the sensed voltages VIL and VIR to the supply voltage Vs. The addition is done by A1C and resistors R30 and R31. Resistors R7, R30 and R31 are the same value. This correction raises Vr by ½ the sense resistor voltage drop balancing the voltage drops across the conducting transistors. The three connections labeled VIL are tied together, as are the three connections labeled VIR. Vr and Vl from the right and left side of the load are connected to R8 and R9.

The bandwidth of the power sharing loop is set to a higher frequency than the current feedback loop to prevent instability since the power sharing loop is an inner feedback loop to the current feedback loop. The bandwidths of the current and sharing loops are adjusted by means well known to those skilled in the art of feedback control. A single sense resistor in series with the load can be substituted for R32 and R20. This circuit can also be used for voltage feedback by replacing VIL and VIR with Vr and Vl.

Figure 2:
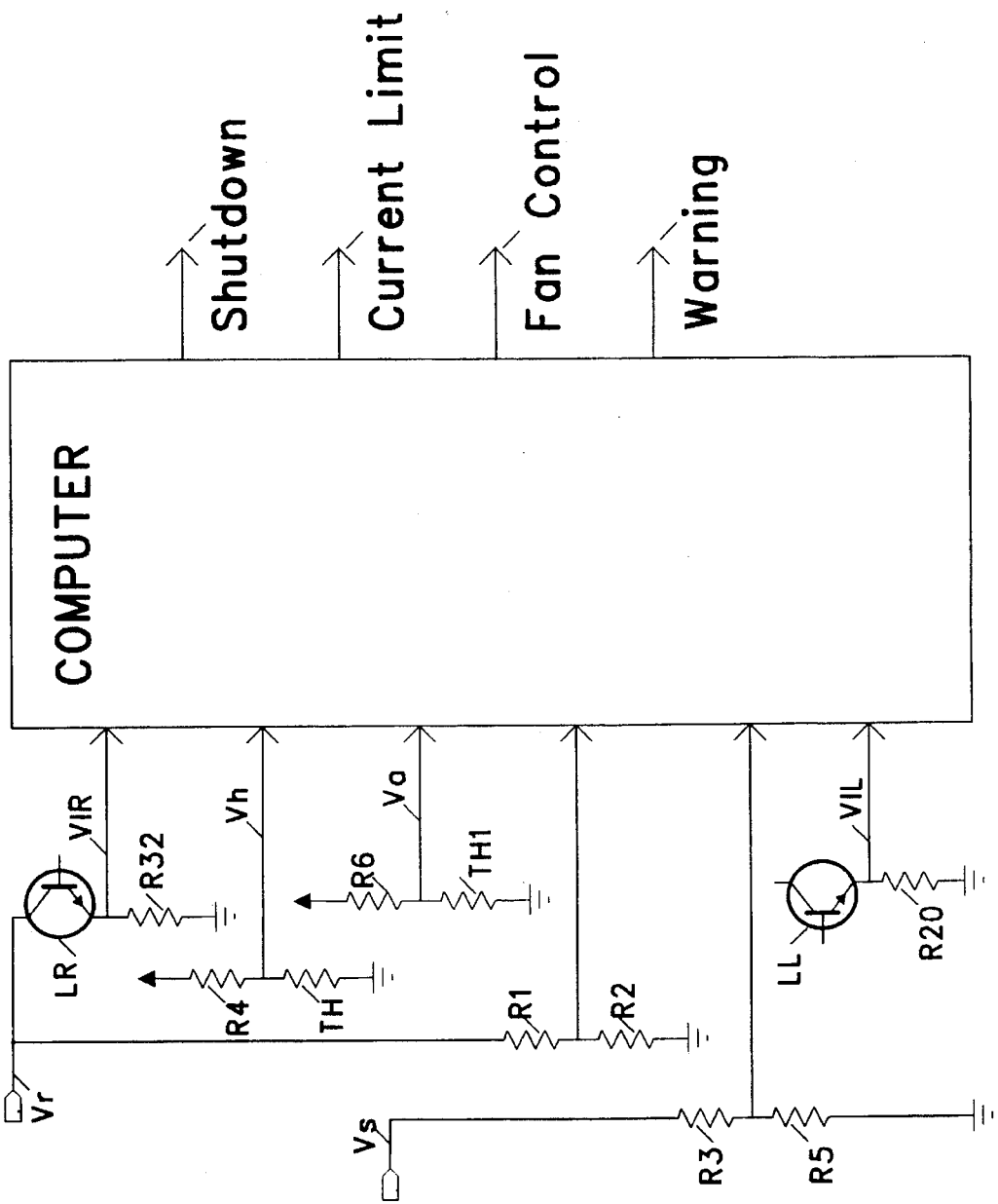
FIG. 2 is a schematic showing the hardware for implementing a drive protection monitor according to this invention having a programmable microcomputer.

Microcontroller:

The hardware for implementing this invention comprises a programmed microcomputer or microcontroller having analog-to-digital inputs and outputs as indicated in FIG. 2.

Figure 3:
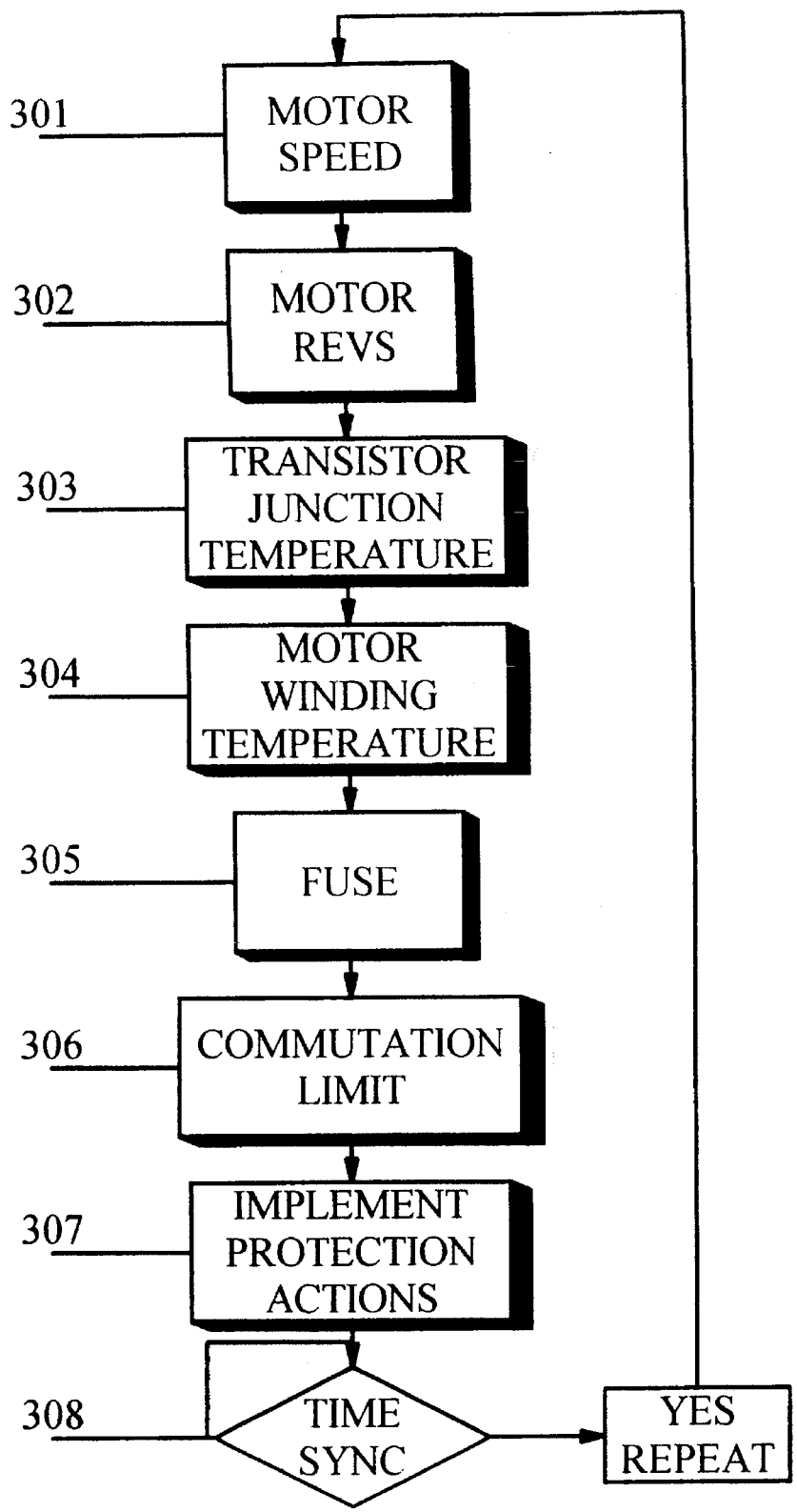
FIG. 3 is a flowchart of the main program for the microcontroller of FIG. 2.

Main Program:

The main loop of a computer program implementing one embodiment of the drive protection monitor according to this invention is illustrated in FIG. 3. FIG. 3 shows the operations which are performed every cycle. These operations are executed many times each second to recalculate and update important parameters being monitored for protection and information. The individual routines do not have to be executed in the sequence shown, and some may be skipped if they are not pertinent to a given application, for example, a brushless motor has no commutation limit and the commutation limit program at 306 would not have to be calculated.

In this embodiment of the invention, the motor speed is determined first at 301. Measurements made during this routine are used by other programs.

Motor revolutions are calculated next at 302 because the cycle time is known as is the speed which was determined in the preceding routine and the revolutions from the previous cycle.

Transistor junction temperatures are then determined at 303 using currents and voltages measured in the speed routine and previous temperature history.

Motor winding temperature is then determined at 304 using current and speed measured in the speed program and previous temperature history.

The temperature of the fuse is then calculated at 305 from the current and previous temperature history.

The commutation limit is determined at 306 from the prior speed calculation.

Finally, any protection necessary from the previous programs such as cooling, annunciation, foldback or shutdown is implemented at 307.

The entire process is repeated after a time delay equal to the sampling time at 308.

Thermal Model:

A limiting characteristic of all power amplifiers, motors and other loads is temperature. Exceeding maximum temperature specifications will reduce the life of, or immediately destroy, these components. Calculating the temperature of the power amplifier, programmable fuse and motor in this invention is accomplished by digitally simulating thermal models (electrical circuit analogs) of the critical devices. A thermal model of the components can be determined from the thermal "resistances" and thermal "capacitances" of the devices.

Figure 4:
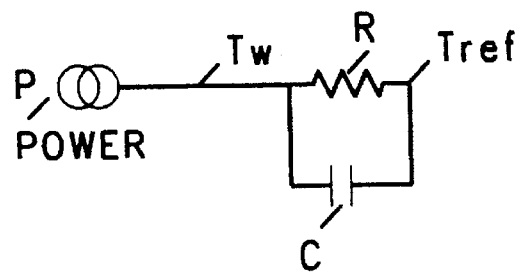
FIG. 4 is a diagram illustrating an electrical circuit analog of the thermal model according to this invention.

The thermal model of FIG. 4 is a continuous model (as are FIGS. 12, 13 and 14) that represents the heating process of the critical device. This continuous model is recast into a discrete model that can be simulated by a digital computer.

FIG. 4 illustrates the basic thermal model used in the invention. The thermal resistance R, degrees per watt, is a measure of the steady state rise in temperature for a given power dissipated in the device. The thermal capacitance C, watt seconds per degree, is related to the specific heat and mass of the materials of these devices. The product of thermal resistance and thermal capacitance is the thermal time constant. One thermal time constant represents the time to achieve 63% of the steady state temperature. The final temperature is achieved in essentially three thermal time constants. The power P, watts, dissipated in the device causes the temperature Tw (calculated temperature), degrees, to rise according to the thermal resistance and time constant plus Tref (reference temperature). The power dissipation results from the current flow in the device and the relationship of power and current is described in the respective sections of this invention. In practice, R sometimes decreases with increasing temperature and this correction can be included in the calculation if desired. Models, such as the electronic fuse, do not require a reference temperature.

The continuous model of FIG. 4 can be converted to a discrete model by means well known to those skilled in the art of sampled data systems. The technique used in this embodiment involved finding the Z Transform of the Laplace Transform of FIG. 4 plus a Zero Order Hold, and generating a Difference Equation. This Difference Equation is $$\Delta T(k) = A * \Delta T(k-1) + B * P(k)$$

where $\Delta T(k)$=differential temperature of the thermal model on the present calculation $\Delta T(k-1)$=differential temperature of the thermal model on the last calculation $P(k)$=present Power dissipated $A = \exp(-Ts/\tau)$ $Ts$=sample time, time between calculations $\tau = R*C$, the thermal time constant $\exp(-Ts/\tau)$ means e to the $-Ts/\tau$ power $B = R*(1-\exp(-Ts/\tau))$ R=thermal resistance associated with the time constant $\tau$

* means multiplication.

The term $A*\Delta T(k-1)$ represents a temperature decrease of the $\Delta T$ which was calculated on the previous sample. The term $B*P(k)$ represents the temperature increase during the sample time interval for the present measured power dissipation $P(k)$. The temperature increase and decrease are added to arrive at the present differential temperature, $\Delta T(k)$. The actual temperature is the sum of the differential temperature and the reference temperature, $Tw=\Delta T(k)+Tref$.

The power amplifier semiconductor junction temperatures, motor winding temperatures, and programmable fuse temperatures are each calculated with this general technique plus specific other techniques, as explained below, to arrive at the temperature of interest. Methods other than the Zero Order Hold, such as a First Order Hold, can be used to convert the continuous model to a discrete model which allows computer calculations.

Figure 5:
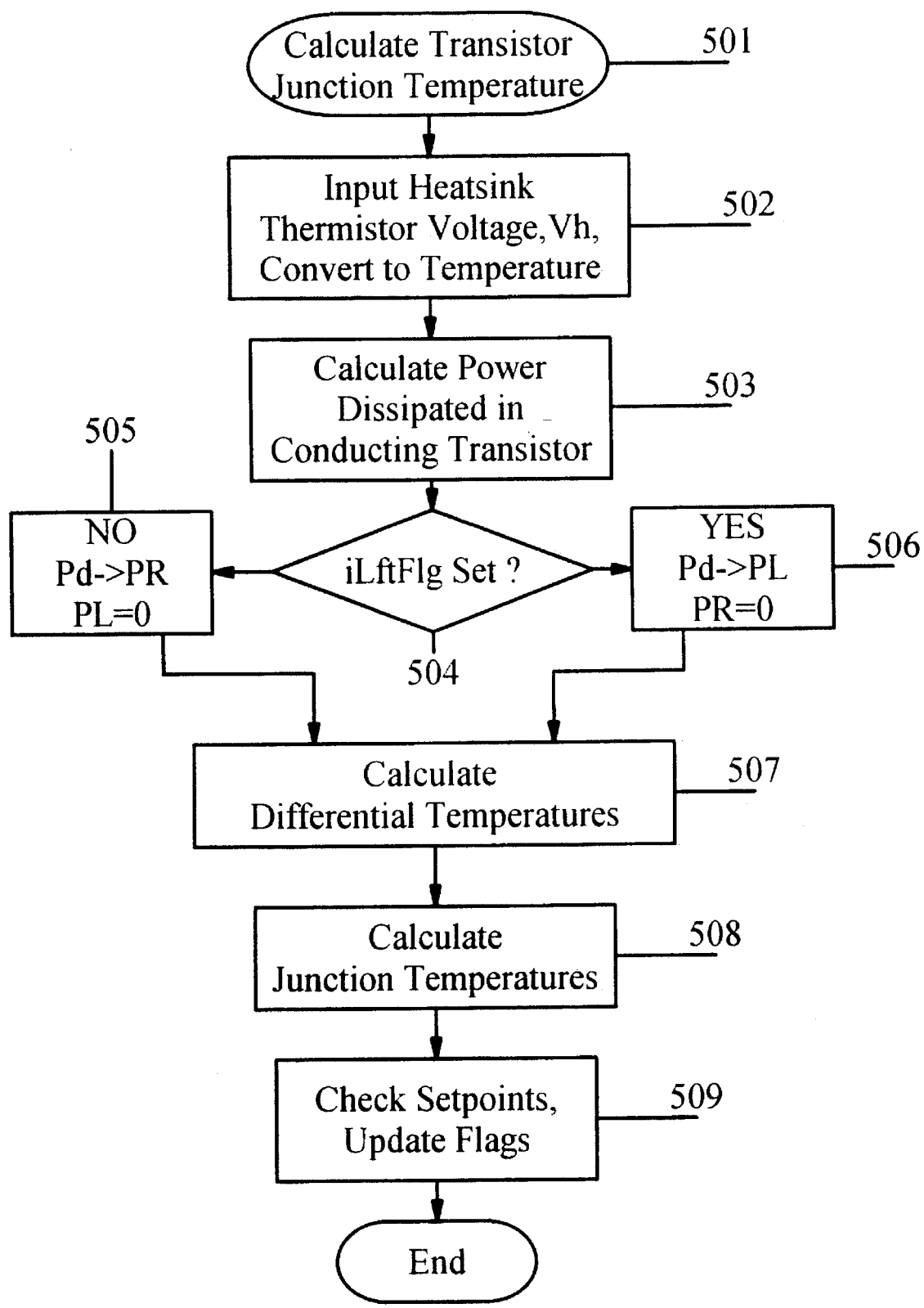
FIG. 5 is a flowchart of a computer program for transistor junction temperature calculation.

Transistor Junction Temperature:

FIG. 5 shows the process of calculating two transistor junction temperatures such as LL and LR in FIG. 1. The power sharing circuit in the linear bridge amplifier forces the two conducting transistors to dissipate the same power; therefore, only two of the four output semiconductor temperatures require calculation because the other two semiconductor temperatures are essentially the same. Two temperatures are calculated to simulate actual conditions that occur when current reverses, that is, current flow in UL and LR is changed to current flow in UR and LL. After current reversal, the temperatures of UL and LR will begin decreasing while the temperatures of UR and LL will begin increasing.

An analog voltage representing the heat sink temperature is converted to a digital magnitude by the analog-to-digital converter and input to the computer at 502. FIG. 2 shows a thermistor connection to the computer that allows the computer to measure the voltage Vh which represents heat sink temperature. The thermistor is mounted on the heat sink. The heat sink temperature is the reference temperature in this embodiment.

At 503, the power dissipation, Pd, of the conducting transistor is calculated as a product of the voltage across, Vso, and the current through, I, a conducting transistor or Pd=Vso*I. Two voltage measurements and two current measurements are used to calculate the power dissipated in the conducting transistors. The voltages are Vs, the supply voltage, and Vr, the right output voltage of FIG. 1. The currents are Il, the current through LL, and Ir, the current through LR. Vso and I are measured in the speed calculation program. An accurate power dissipation calculation requires subtracting the voltage drop across the right current sense resistor, R32, from the measured Vr when current flows through the right sense resistor, if there is a sense resistor to ground. The voltage drop across the left sense resistor, R20, is ignored when current flows through R20 because Vs−Vr= Vso in this condition.

This embodiment shows the power dissipation calculation for a transistor operating in the linear mode. If a switching semiconductor was being monitored, the power dissipation could be calculated using only current, where that current is multiplied by a nonlinear resistance that is a function of the current magnitude. A further refinement would measure the average output voltage to determine semiconductor conduction time. Another refinement would be the measurement of the transistor saturated voltage and conduction time.

At 504, the iLftFlg signal, a flag set in the speed program that identifies which lower transistor is conducting current and dissipating the power Pd, is checked. If LR is conducting current, Pd is assigned to PR (power in the right transistor) at 505 and PL (power in the left transistor) receives zero dissipation. If LL is conducting current, Pd is assigned to PL at 506 and PR receives zero dissipation.

At 507, the temperature change from junction to case of each transistor, LL and LR, is calculated according to the general method discussed above. Separate $\Delta T$s are kept track of for each lower transistor.

Referring to the transistor thermal model shown in FIG. 13, the elements labelled on the model are set forth below:

I=semiconductor current

Tjunction=semiconductor junction temperature

Tcase=semiconductor case temperature hsT=heat sink temperature

Tamb=ambient temperature

Vso=voltage across the conducting transistor

R1, C1=semiconductor junction to case thermal resistance and capacitance

R2=case to sink thermal resistance

R3, C3=sink to ambient thermal resistance and capacitance. R3 depends on forced air cooling.

Figure 13:
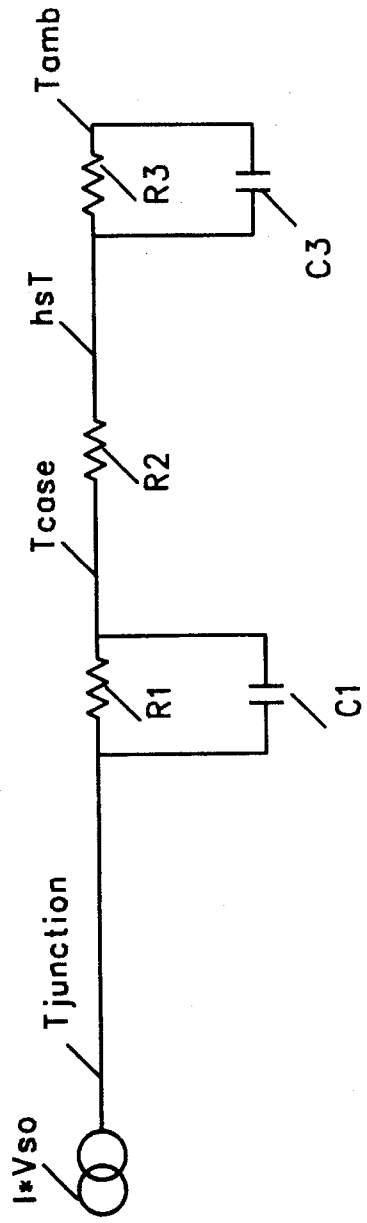
FIG. 13 is a diagram illustrating the transistor thermal model.

The thermal model of FIG. 13 differs from the basic model of FIG. 4. One difference is the addition of the case to sink thermal resistance, R2. The thermal capacitance associated with this case to sink interface is essentially zero because the mass is small. R2 can be the same order of magnitude as R1, the junction to case thermal resistance of the semiconductor, and since the time constant associated with R2 is negligible, an instantaneous rise in temperature is produced. The differential temperature is $\Delta T(k)=A*\Delta T(k-1)+B*P(k)$ and does not include the temperature increase from R2 since R2 is separate from A and B. A is $\exp(-Ts/\tau)$ where $\tau$ is the thermal time constant of R1 and C1. B is $R1*(1-\exp(-Ts/\tau))$. The second difference from the thermal model of FIG. 4 is that the reference temperature is the heat sink temperature, hsT. Heat sink temperature is easily accessible and simplifies calculations when forced air cooling is used because the model remains essentially the same under forced air or convection cooling. Using heat sink temperature as the reference also eliminates the calculations associated with the heat sink. Ambient temperature can be ignored since it affects heat sink temperature.

At 508, the junction temperatures for the conducting and nonconducting transistors are calculated. The junction temperature of the conducting transistor becomes $Tj=A*\Delta T(k-1)+B*Pd(k)+Pd(k)*R2+hsT$. The non-conducting transistor junction temperature becomes $Tj=A*\Delta T(k-1)+hsT$.

At 509, the highest new temperature is then compared to set points to determine if cooling, warning, foldback or shutdown action must be taken.

Foldback:

The ability to monitor the temperature of the semiconductor, motor and fuse, combined with the ability to reduce current, enables this invention to foldback current. Reducing current will limit the temperature being monitored and prevent shutdowns due to over temperature. The reduction of current will also reduce motor torque and process throughput, but allow the process to continue. Reducing current in the linear power amplifier may initially increase power dissipation under certain conditions, but will eventually reduce power dissipation when current is reduced further.

Figure 6:
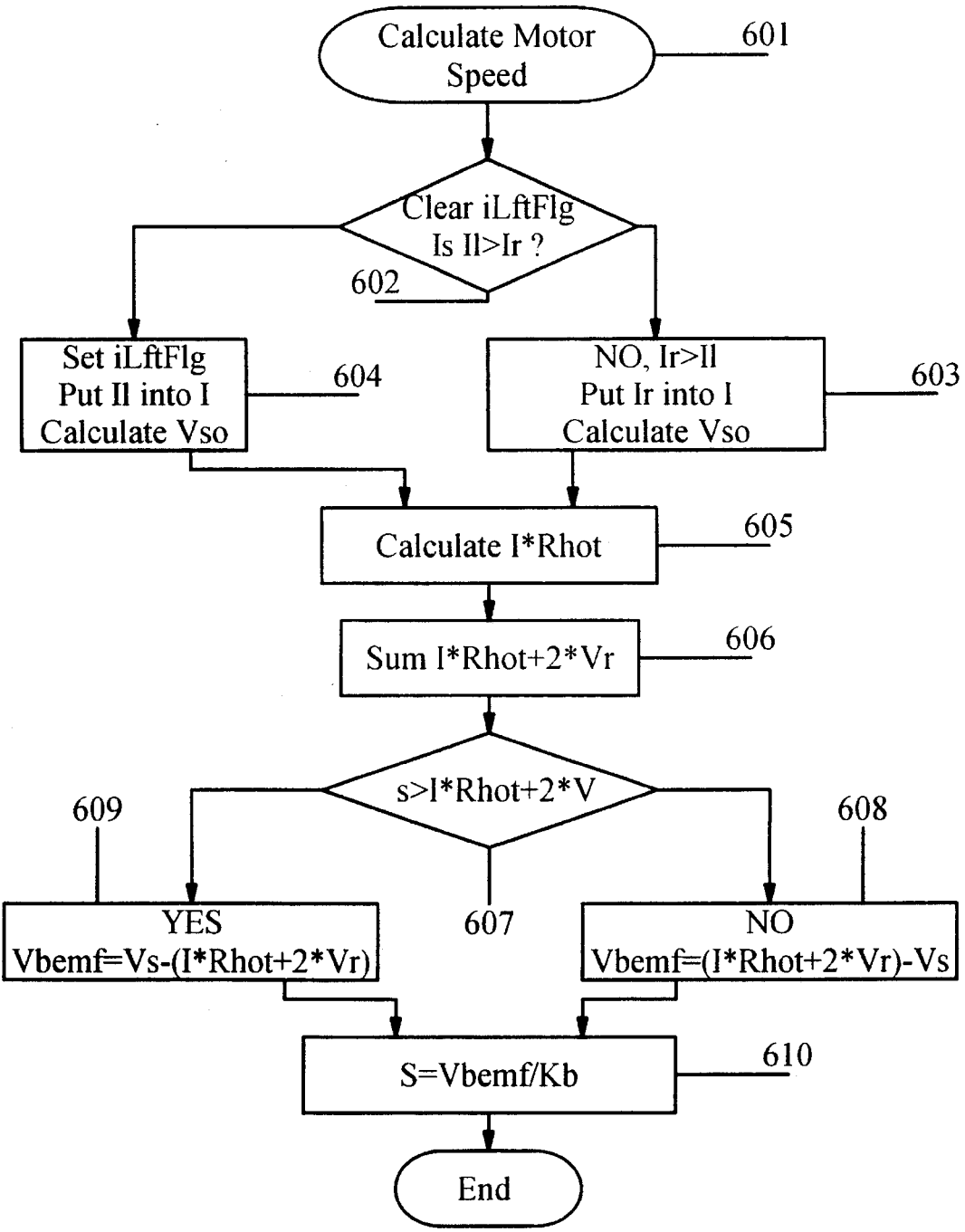
FIG. 6 is a flowchart of a computer program for motor speed calculation.

Motor Speed Calculation:

FIG. 6 shows the computer implemented process of determining motor speed with no additional sensor. The voltage across a permanent magnet motor is the sum of the back emf voltage representing speed, $Vbemf=S*Kb$, and the voltage across the motor ohmic resistance, $I*R$. The speed calculation is complicated by the facts that the back emf polarity is not related to the direction of current flow, and the motor ohmic resistance is not easily known because it depends on the winding temperature. Motor ohmic resistance varies about 50% from a cold to a hot motor because of the copper winding temperature coefficient preventing accurate subtraction of the voltage across the motor due to $I*R$. In my invention, the motor speed is calculated by measuring the voltage across the motor, subtracting the drop due to the product of I and Rhot (I*Rhot) since Rhot was calculated previously, and calculating the speed by using the remaining back emf divided by the back emf constant Kb. That is, $S=(Vmotor-I*Rhot)/Kb$. The actual calculation reduces to S=absolute magnitude of $(Vs-(2*Vr+I*Rhot))/Kb$, where the measured Vr is replaced by Vs-Vr when current flows through LL of FIG. 1.

At 602, a flag, iLftFlg, is first cleared to mark the direction of current flow since current direction is needed to calculate the voltage across the motor with one measurement of motor voltage. Both left and right currents are measured, Il and Ir shown in FIG. 1, and the largest determines the current direction. The largest measured current is then placed into I, the motor current.

At 603, the iLftFlg is left cleared if the current is determined to be flowing in LR, and Vso is set to Vr–VIR, where VIR is the voltage across the current sense resistor, R32 of FIG. 1. The voltage across the conducting transistor, Vso, is used in the transistor junction temperature program.

At 604, the iLftFlg is set if the current is determined to be flowing in LL. The measured voltage of the right side, Vr, is replaced by Vs–Vr when current flow is through LL because Vr is then the sum of Vl plus the motor voltage. It can be shown that the motor voltage is Vs–2*Vr because the power sharing circuit forces the voltage across the top and bottom conducting transistors to be the same. If current flow is through LL, Vso is set to Vs–Vr.

At 605, Rhot, the hot motor resistance calculated in another program, is multiplied by the current, I, to determine that part of the motor voltage which is not due to speed.

At 606, I*Rhot is then summed with twice the voltage Vr, remembering from above that Vr is the measured Vr or Vs–Vr, depending on the direction of current flow.

A refinement is necessary for accurate speed calculation when current sense resistors R20 and R32 are used to sense current for feedback. The voltage VIL or VIR across R20 or R32 was included in the Vr measurement. The correction is to add VIR to Vs when current is through LR or subtract VIL from Vs when current is through LL.

At 607, the magnitude of Vs (adjusted for VIL or VIR) is compared to I*Rhot+2*Vr to determine which has the largest magnitude, then the smallest magnitude is subtracted from the largest to determine the back emf voltage at 608 or 609.

At 610, the remaining voltage, Vbemf, is then divided by Kb, the motor back emf constant, to calculate the motor speed S.

Figure 7:
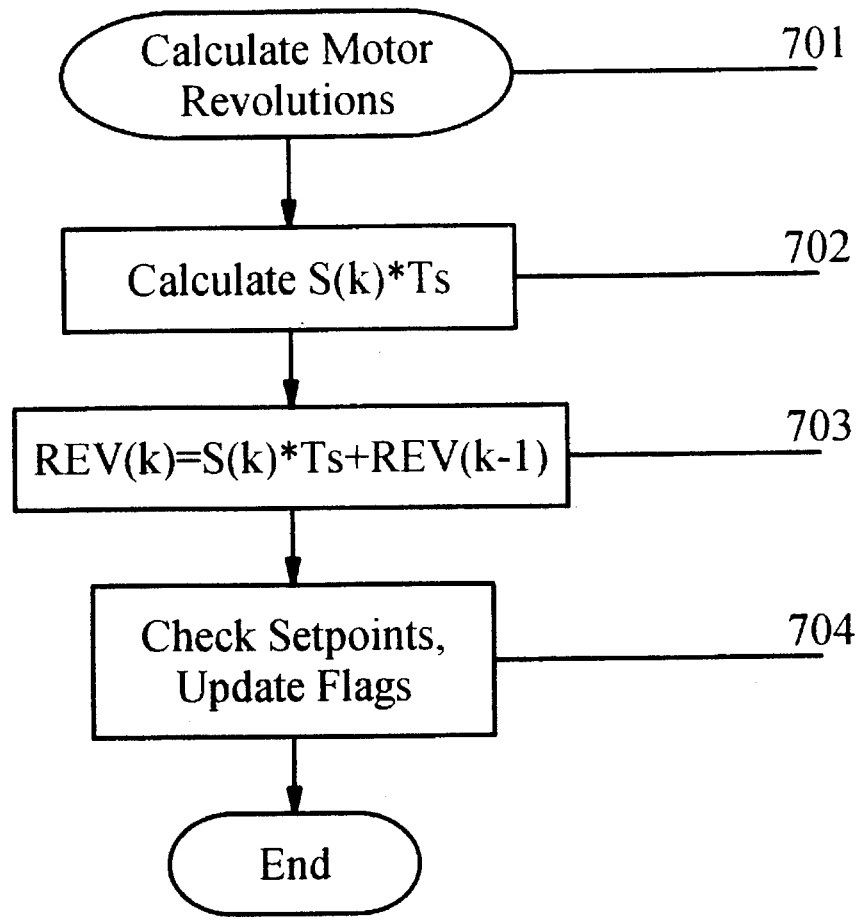
FIG. 7 is a flowchart of a computer program for motor revolution counting.

Motor Revolution Counting:

FIG. 7 shows the computer implemented process of determining the number of motor revolutions. The motor speed, S, is calculated in a previous program. That speed is used to calculate the revolutions traveled during the sample time and added to the previous number of revolutions according to the difference equation $REV(k)=REV(k-1)+S(k)*Ts$ where Ts is the sample time.

At 702, the speed calculated previously is multiplied by the sample time to yield the new revolutions which have occurred since the last sample. If weighting is desired, S is replaced by the product of S and a weighting factor.

At 703, the new revolutions are added to the old revolutions to obtain the total revolutions.

At 704, the total revolutions are compared with set points to determine if a warning or shutdown is necessary.

Figure 8:
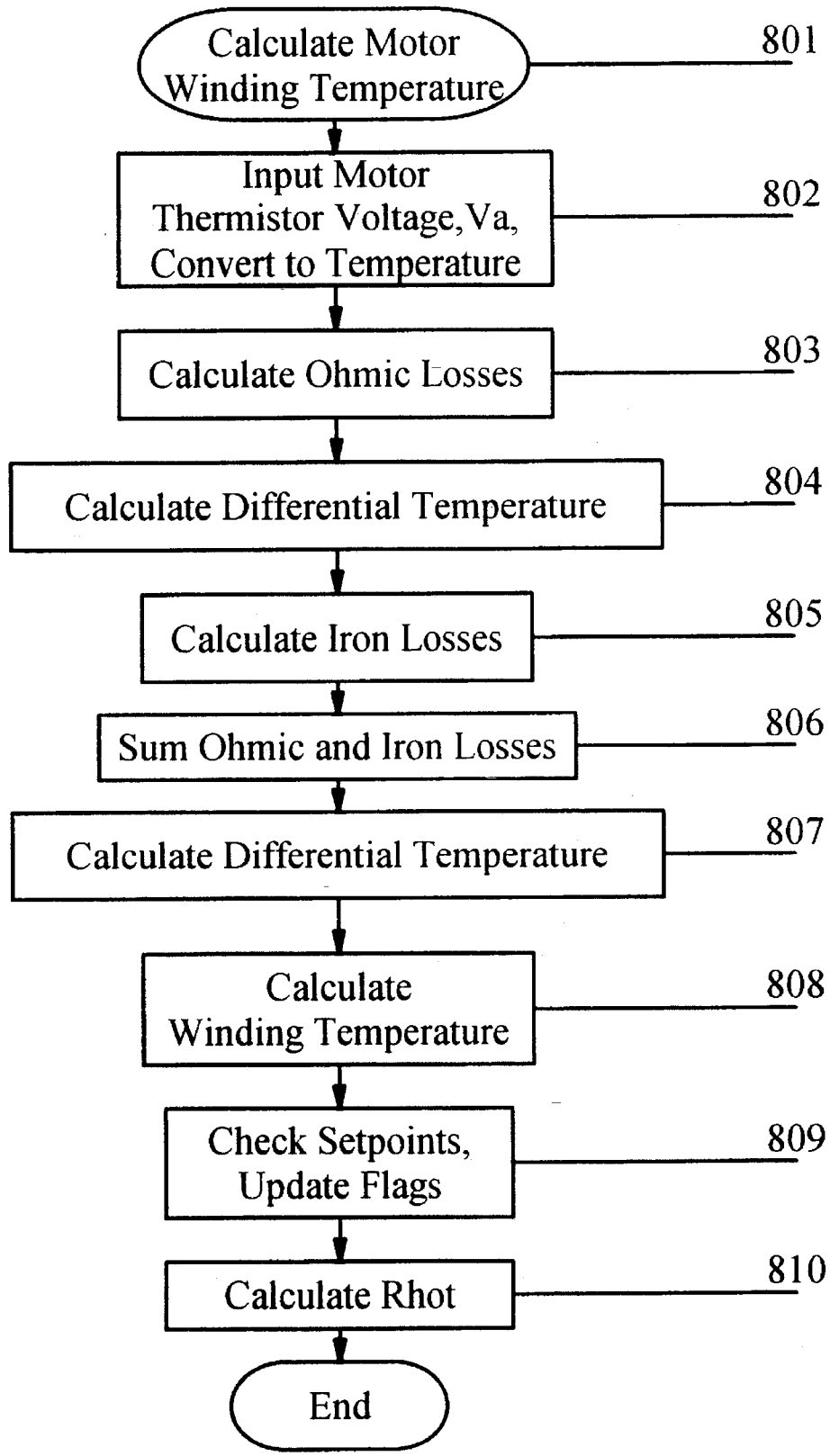
FIG. 8 is a flowchart of a computer program for motor winding temperature calculation.

Motor Winding Temperature:

FIG. 8 shows the computer implemented process of calculating the rotating winding temperature of a motor or other load without an embedded thermistor or temperature sensing device.

An analog voltage representing the case or other accessible temperature, Va, is converted to a digital magnitude by the analog-to-digital converter and input to the computer at 802. FIG. 2 shows a thermistor connection to the computer that allows the computer to measure the voltage that represents the reference temperature. If the case temperature will always be constant, such as if the case is mounted to a constant temperature infinite heat sink, a constant value of resistance can replace the thermistor or a constant temperature can be substituted for the measured reference temperature.

Figure 12:
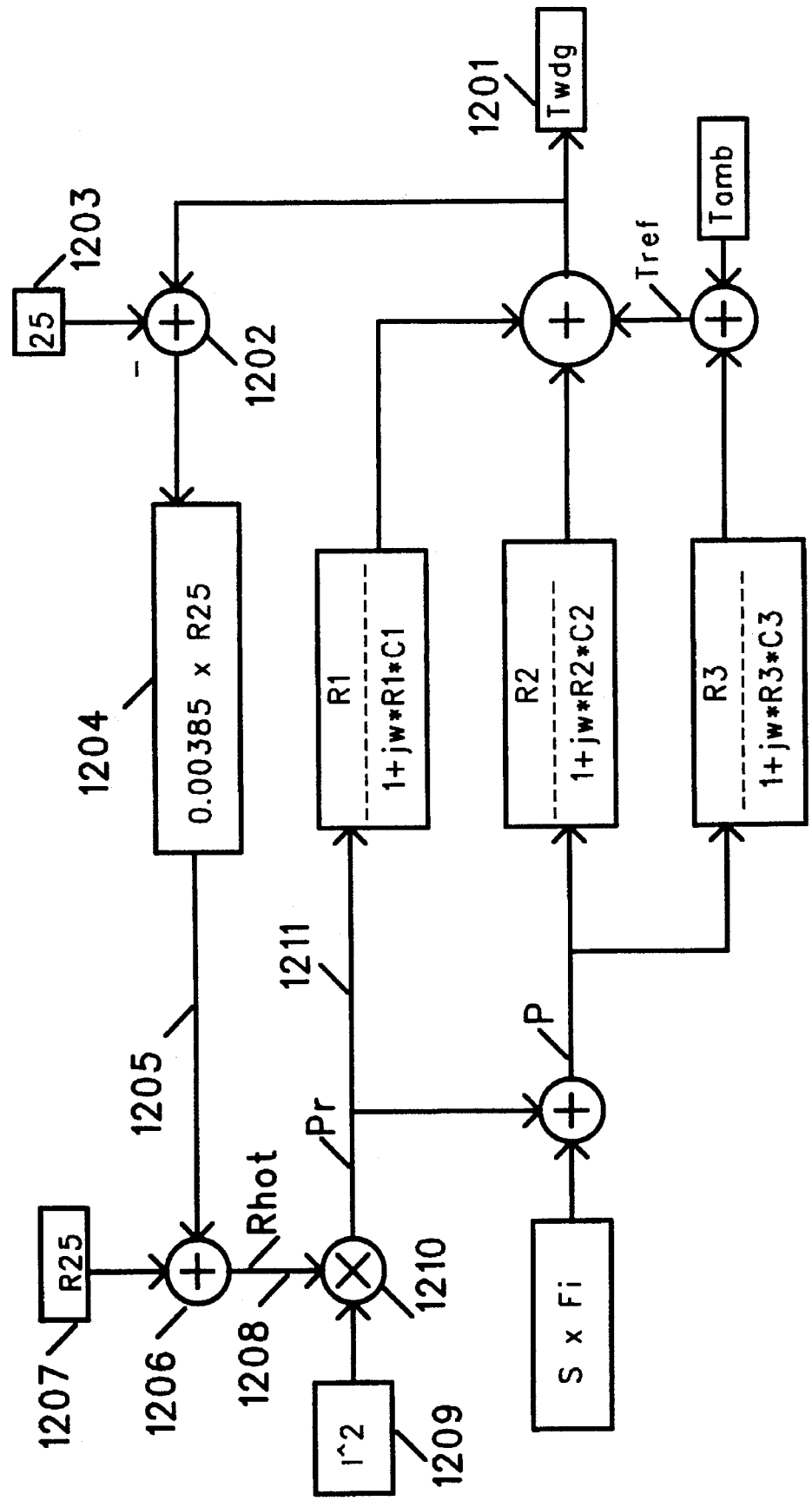
FIG. 12 is a diagram illustrating the motor thermal model in the frequency domain.

At 803, the motor heating due to ohmic losses, Pr, is calculated using the product of current squared and the last calculated hot value of resistance, Rhot, since this is the true heating action in the motor (Pr=I*I*Rhot). The motor thermal model of FIG. 12 shows how the motor winding temperature affects the motor heating. The elements labelled on the model are set forth below:

I^2=motor current squared

Twdg=winding temperature

Tref=reference temperature

Tamb=ambient temperature

S=motor speed

Fi=rotational losses

R25=armature resistance at 25° C.

Rhot=armature resistance at Twdg temperature

R1, C1=copper thermal resistance and capacitance

R2, C2=lam thermal resistance and capacitance

R3, C3=mounting thermal resistance and capacitance jw=complex frequency

The winding material ohmic resistance depends on the temperature of the winding. Ignoring this factor will produce a 50% error in heating for the typical allowable hot winding temperature of 155° C. The temperature coefficient for copper windings is 0.00385 at 25° C. To calculate Rhot, the winding temperature, Twdg, at 1201 is summed at 1202 with a negative 25 from 1203 and multiplied by R25, the winding resistance at 25° C. This product is further multiplied by 0.00385 at 1204 to form the ohmic resistance increase due to temperature at 1205. At 1206 the increase is summed with R25 from 1207 to produce the hot winding resistance, Rhot at 1208, at the present winding temperature, Twdg. Rhot is then multiplied at 1210 by I squared from 1209 to produce the true ohmic losses in the motor at 1211, Pr.

At 804, the differential temperature of R1 and C1, ΔT1(k), is calculated according to the method discussed above, ΔT1(k)=A1*ΔT1(k−1)+B1*Pr(k). A1 is exp(−Ts/τ1) where τ1 is the thermal time constant of R1 and C1. B1 is R1*(1−exp(−Ts/τ1)).

At 805, iron losses from hysteresis and eddy currents, S×Fi of FIG. 12, are then calculated using motor speed that was determined in a previous program, Pi=S*Fi. Iron losses occur in the laminations and are important at high motor speeds. These losses can be represented as proportional to speed or to a power of speed. In this embodiment the iron losses are proportional to speed. Since the iron losses occur in the laminations, they are not directly applied to R1 and C1. Iron losses that arise from the variation in magnetic field due to ripple current in PWM amplifiers can be added to S×Fi if they are appreciable. Nonferrous armatures will have no iron losses.

At 806, the ohmic and iron losses are summed, P=Pr+Pi.

At 807, the differential temperature of the iron, ΔT2(k), is then calculated according to the general method discussed above, ΔT2(k)=A2*ΔT2(k−1)+B2*P(k). A2 is exp(−Ts/τ2) where τ2 is the thermal time constant of R2 and C2. B2 is R2*(1−exp(−Ts/τ2)).

At 808, the differential temperatures, ΔT1(k)+ΔT2(k), for the motor winding are then added to the reference temperature, Tref, to arrive at the final winding temperature, Twdg= ΔT1(k)+ΔT2(k)+Tref. In this embodiment, the reference temperature is taken as the case temperature, an easily measured parameter. This gives an accurate indication of the winding temperature and better protection when external factors affect the case or mounting temperature. Using case temperature as the reference also eliminates the time constant calculations associated with R3 and C3 of FIG. 12. Ambient temperature can be ignored since it affects case temperature.

At 809, this new winding temperature is then compared to set points to determine if cooling, warning, foldback or shutdown action must be taken.

At 810, the latest winding temperature is used to calculate the latest hot resistance for the motor winding to be used in the next calculation of ohmic losses, Rhot=R25(1+0.00385(Twdg−25)).

If forced air cooling is initiated or the motor thermal resistances are effected by motor speed, new constants A and B are used for the ΔT(k) calculation on the following cycle. A simplified thermal model can be obtained by combining the copper loss and iron loss models.

Figure 11A:
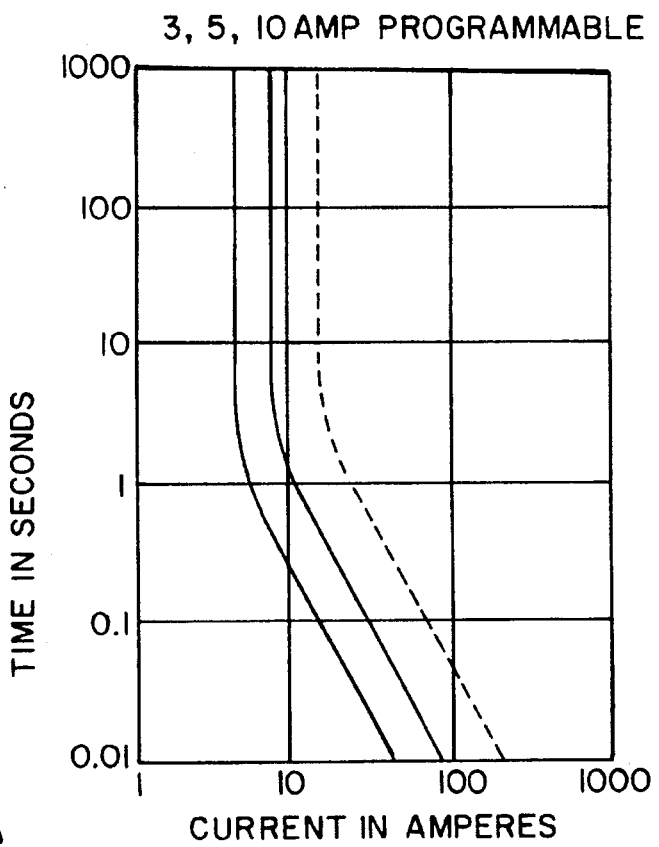
FIGS. 11A–11C are charts showing the characteristics of programmable fuses and actual fuses.
Figure 11B:
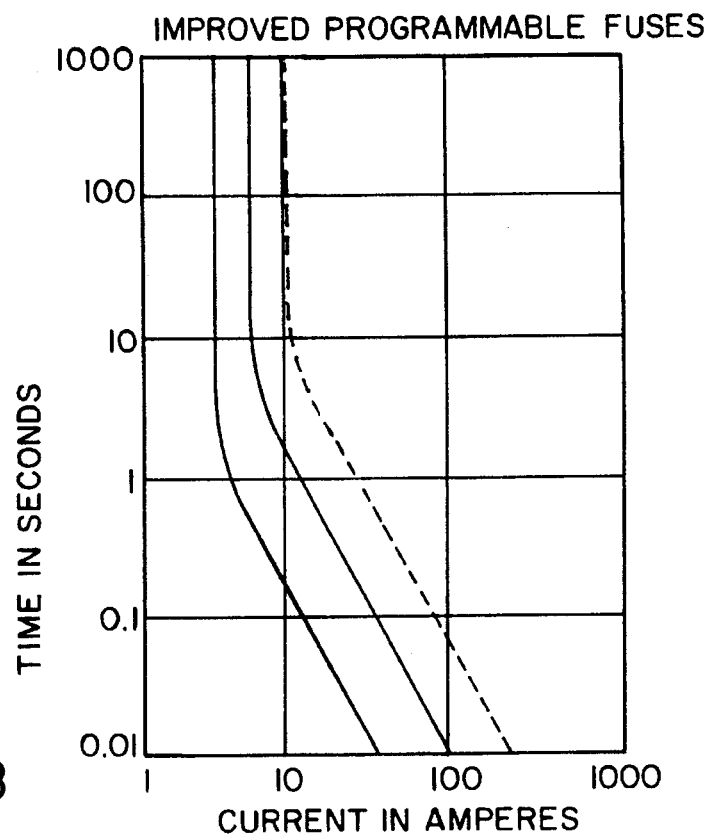
Figure 11C:
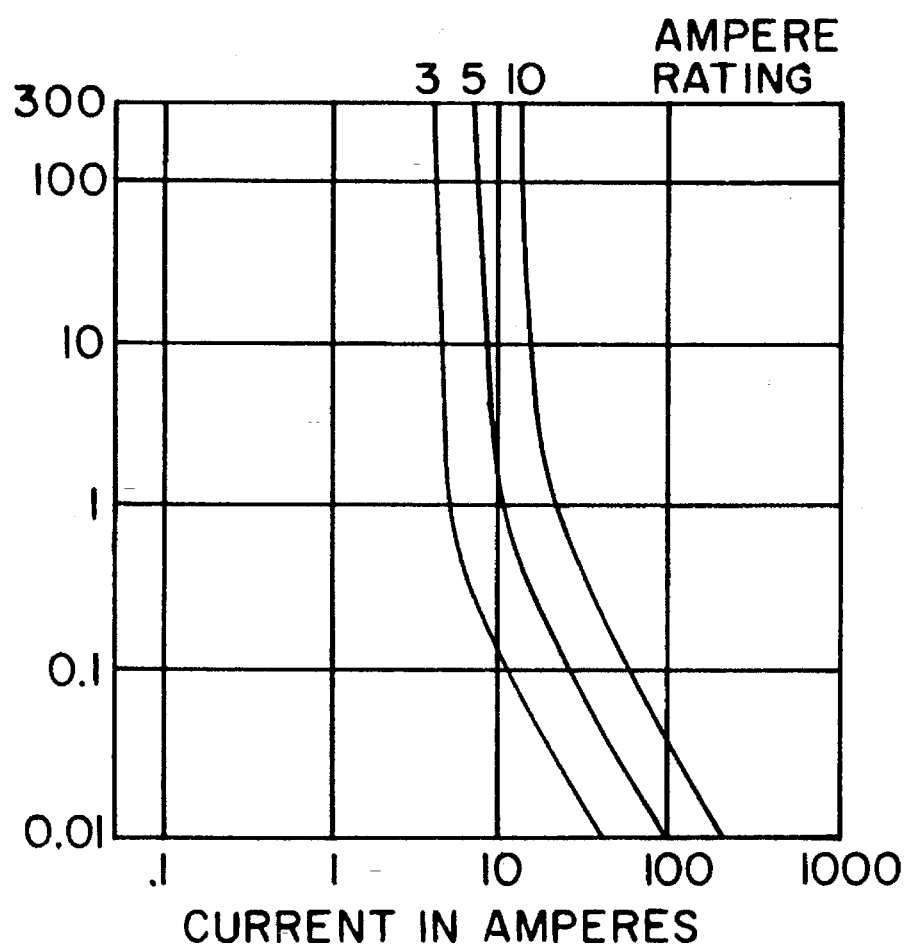

Programmable Fuse:

FIG. 11C shows typical fuse characteristics for 3, 5 and 10 amp fast acting fuses. These curves show the time versus current characteristic that melts the fuse element, blowing (opening) the fuse and protecting some load. Various blowing currents and time constants are obtained by changing the fuse element.

Figure 14:
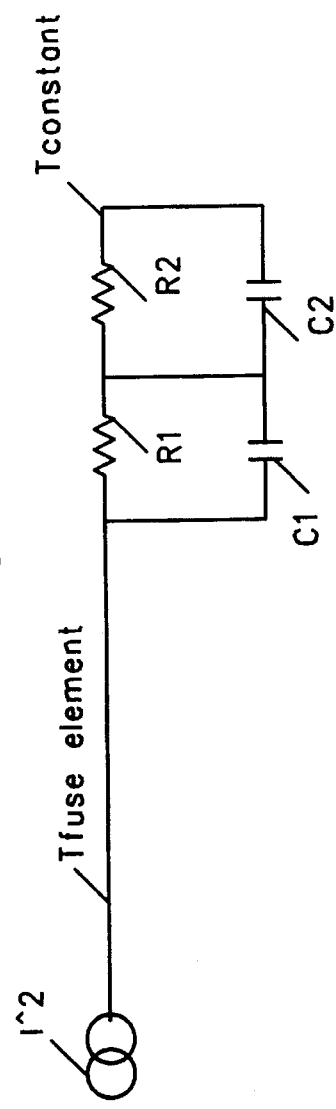
FIG. 14 is a diagram illustrating the programmable fuse thermal model.

A fuse curve can be simulated with the programmable fuse thermal model of FIG. 14. The elements labelled in the model are set forth below:

I^2=fuse current squared

Tfuse element=fuse temperature

Tconstant=constant reference temperature

R1, C1=fuse thermal resistance and capacitance

R2, C2=fuse thermal resistance and capacitance.

The blowing current can be changed by adjusting the thermal resistance, and the time constant can be changed by adjusting the thermal capacitance; the time constant shows up as the time where a straight line drawn through the fuse curve at large currents intersects the blowing current on a loglog scale. Two different thermal time constants of 1 and 5000 seconds produce the 3 amp programmable fuse curve (far left) of FIG. 11A that simulates the actual fuse 3 amp curve of FIG. 11C.

An improved fuse characteristic can be obtained by using a single time constant as shown in FIG. 11B. The blowing time of the improved fuse characteristic is three time constants at the blowing current. For example, the actual 3 amp fuse of FIG. 11C takes more than 300 seconds to blow at a current of 4 amps, even though this is a fast acting 3 amp fuse. The single 1 second time constant 3 amp improved programmable fuse interrupts a 3 amp load in about 3 seconds.

Figure 9:
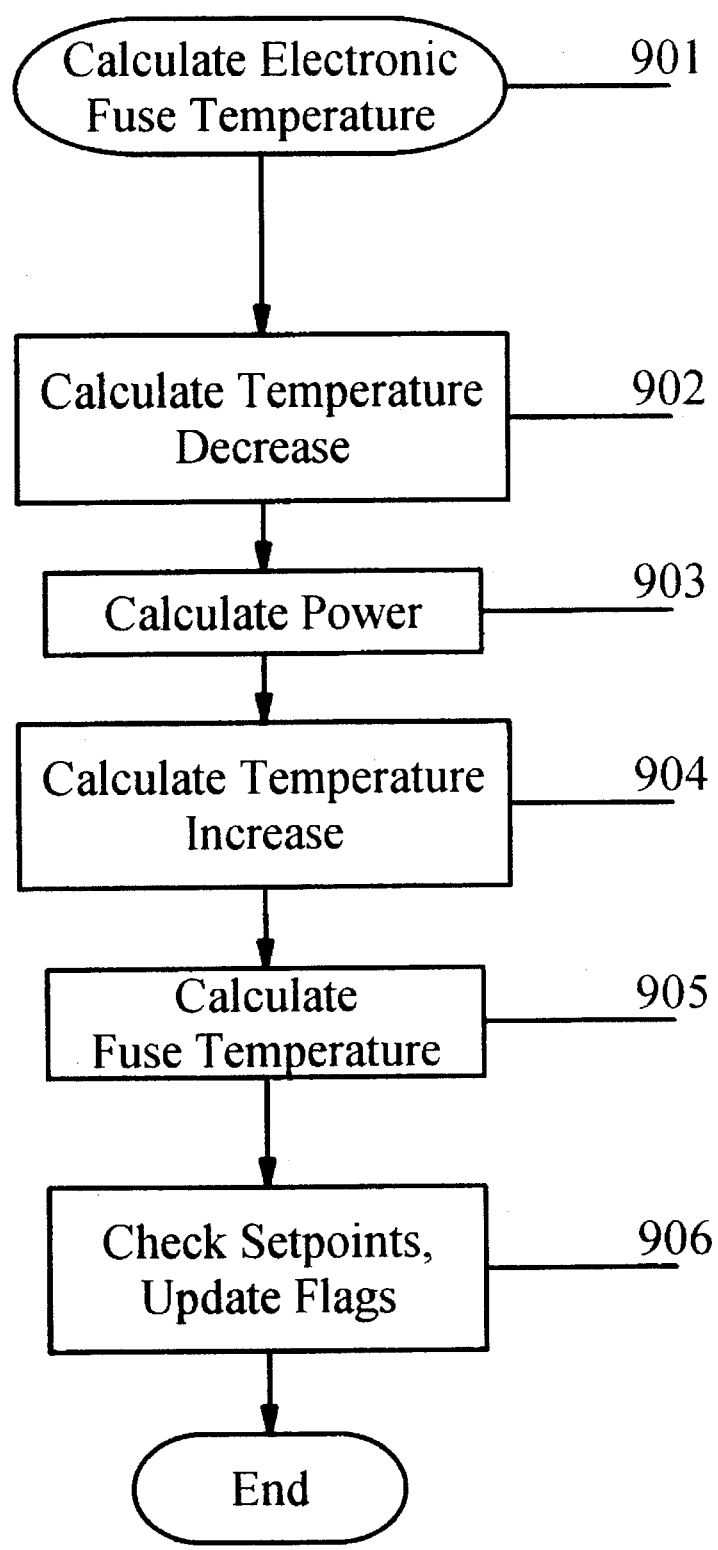
FIG. 9 is a flowchart of a computer program for programmable fusing.

FIG. 9 shows a computer program for implementing a programmable fuse for any load. The temperature of the fuse element is calculated according to the general method discussed above. This temperature is compared to set points to determine when the fuse should be blown, or other actions taken. The embodiment of FIG. 9 is for the improved single time constant programmable fuse model.

At 902, the fuse temperature decreases since the last calculation cycle is determined according to A*ΔT(k−1). A is exp(−sample time/fuse time constant). The term exp(x) means that e is taken to the x power. Software checks are implemented to prevent decreasing below zero.

The load current is measured by the analog-to-digital converter through the current sense input as shown in FIG. 2 and converted to current by the computer in another part of the program.

At 903, the fuse element heating from load current, P, is calculated as a product of the load current squared and a fixed value of resistance (P=I*I*Rfuse). A resistance that depends on temperature could be used to change the apparent time constants. The resistance, Rfuse, is chosen according to the blowing current programmed. In this embodiment of the invention, the blowing temperature is chosen to be 200. The product of the blowing current squared, ohmic resistance and thermal resistance must then equal 200.

At 904, the temperature increase of the fuse is then calculated according to B*P(k). B is the product of the fuse thermal resistance and 1−exp(−sample time/fuse time constant).

At 905, the temperature increase and decrease, ΔT(k), for the fuse is then combined to arrive at the present fuse temperature, ΔT(k)=A*ΔT(k−1)+B*P(k). The reference temperature, Tconstant, is set at zero.

At 906, this new temperature is compared to set points to determine if warning, foldback or shutdown action must be taken, and status flags are updated. Another part of the program will execute the action to be taken, such as turning off the power amplifier if the blowing characteristic was exceeded.

Figure 10:
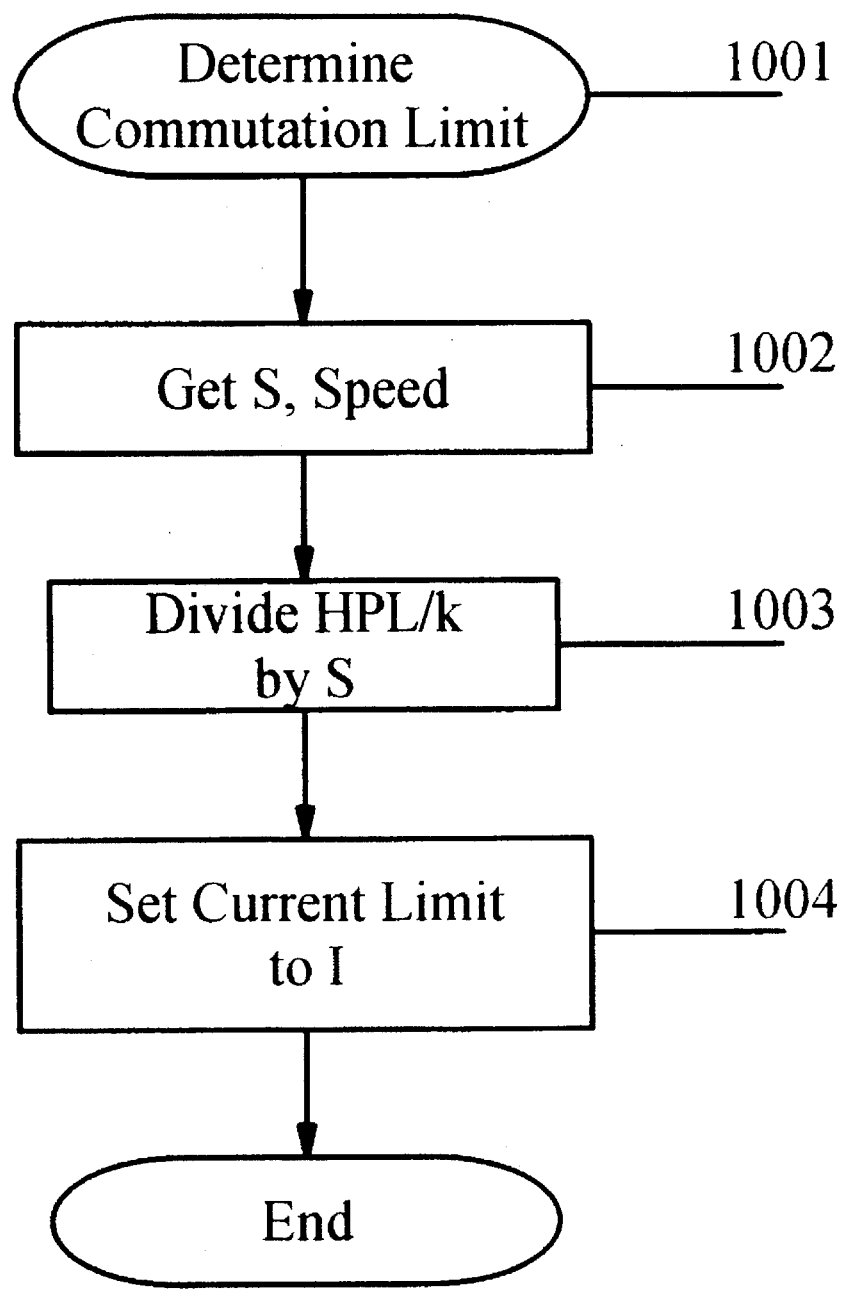
FIG. 10 is a flowchart of a computer program for commutation limit implementation.

Commutation Limit:

FIG. 10 shows a computer program to implement the process of commutation limit for a brush-type motor. Brush wear, measured as centimeters to the third power per centimeter of sliding distance, is proportional to current and speed, but increases considerably with arcing. Arcing occurs under conditions of high speed and current. Brushtype motor vendors establish a limit, known as the commutation limit, above which rapid brush wear occurs. This limit approximates a constant horsepower region, a product of torque (or current) and speed. If a constant horsepower region does not fit the commutation limit, a nonlinear approximation can be used.

If motors are not operated below the commutation limit, high brush wear occurs. To operate below the commutation limit requires the motor current to be limited such that the product of torque (or current) and speed remains below some constant value called the horsepower limit, HPL.

$$HPL = k1*S*T$$
$$= k*S*I \text{ since } T = Kt*I$$

where k1=conversion factor

T=Torque developed by the motor

S=Speed of motor k=Kt*k1

I=motor current

Kt=Motor torque constant.

At 1002, the speed calculated in an earlier-described program is input. At 1003, the HPL, divided by a constant proportional to the torque constant of the motor, is divided by the speed to arrive at the current which produces the HPL (I=HPL/k/S).

At 1004, the computer then sets the current limit to this new calculated current limit, if it does not exceed the preprogrammed current limit, keeping the power to the motor within the commutation limit.

Having thus described my invention with the detail and particularity required by the Patent Laws, what is claimed and desired protected by Letters Patent is set forth in the following claims.

I claim:

1. An apparatus for monitoring the temperature of an inaccessible portion of an electrical current carrying device that cannot be directly measured easily comprising:

means for establishing a reference temperature value comprising means for continuously measuring an accessible temperature in the vicinity of the current carrying device;

means for measuring the power dissipated in the current carrying device;

a digital computer;

means for inputting to the digital computer, the reference temperature value, the power dissipated in the current carrying device, the thermal resistances and thermal time constants of the thermal model simulating the current carrying device to the reference temperature; and means comprising the digital computer for continuously calculating a differential temperature based upon the power dissipation and thermal model and adding the reference temperature thereto.

2. The apparatus according to claim 1 in which the differential temperature is established:

by calculating the power dissipation in the current carrying device;

by multiplying the current by the voltage drop across the device or by multiplying the current squared by a resistance to obtain power dissipation, where said resistance may be a function of the current or temperature; and by multiplying the power dissipation by the thermal resistance and by a time function based upon thermal time constants to arrive at a temperature increase and by multiplying the differential temperature calculated previously by a time function based upon thermal time constants to obtain a temperature decrease and by adding the temperature increase and the temperature decrease to obtain the differential temperature across a portion of the thermal model.

3. An apparatus according to claim 1 in which the power dissipation in the current carrying device is measured by measuring the current through the device and the voltage across the device.

4. An apparatus according to claim 1 in which the power dissipation in the current carrying device is measured by measuring the current through the device and calculating the dissipation based upon the resistance of the device adjusted for the temperature of the device.

5. The apparatus according to claim 3 in which the reference temperature is the ambient temperature and the thermal model accounts for heat transfer from the winding of the motor to the motor case and from the case to the ambient air.

6. An apparatus according to claim 1 wherein the differential temperature comprises two components, a positive differential resulting from power dissipation, if any, and a negative differential based upon heat transfer away from the device.

7. The apparatus according to claim 1 wherein the current carrying device is an output semiconductor in a power amplifier and the portion of the temperature of which is calculated is a semiconductor junction.

8. The apparatus according to claim 1 wherein the current carrying device is a winding in an electrical motor further comprising means for measuring the rotational speed of the motor, means for inputting the rotational speed to the computer, means comprising the computer for continuously calculating power dissipation related to motor speed and rotational loss term, and adding speed dependent rotational losses to the power dissipation based upon current through the winding.

9. The apparatus according to claim 8 further comprising means for measuring the rotational speed of the motor comprising:

means for measuring voltages to calculate the voltage drop across the motor;

means comprising the digital computer for calculating the IR drop across the motor by multiplying the electrical current by the electrical resistance adjusted for temperature as that temperature was calculated in a previous step; and means comprising the digital computer for calculating the back emf of the motor by subtracting the calculated IR drop from the calculated voltage drop across the motor and calculating the speed by comparing the back emf to the established relationship between motor speed and back emf.

10. The apparatus according to claim 9 for integrating the calculated speed over time to record motor revolutions.

11. The apparatus according to claim 9 wherein the calculated rotational speed is used to limit current in a way to reduce the brush wear in a mechanically commutated motor.

12. A bridge amplifier having four output semiconductors in two pairs, each pair connected in series between the bus voltage and ground, the output of the semiconductor bridges being across the junctions between the semiconductors in both pairs, a driver for controlling the semiconductors in one pair to connect the output common thereto to either the bus voltage or to ground, a rapid response driver with bus voltage input for controlling the semiconductors in the other pair such that the voltage on the junction of one pair is the bus voltage minus the voltage of the junction on the other pair, whereby the voltage across the conducting semiconductor of one pair is essentially the same as the voltage across the conducting semiconductor of the other pair.

13. The apparatus according to claim 1 in which the thermal model has a plurality of thermal time constants and thermal resistances corresponding to a plurality of thermal time constants and thermal resistances between the inaccessible portion of the current carrying device and the means for establishing a reference temperature.

14. The apparatus according to claim 1 in which the device is a motor, the reference temperature is the ambient temperature and the thermal model accounts for heat transfer in the motor winding, the motor laminations and the mounting with thermal time constants corresponding to each.

15. An apparatus for monitoring the temperature of an inaccessible portion of an electrical current carrying device that cannot be directly measured easily comprising:

means for establishing a reference temperature value in the vicinity of the current carrying device;

means for measuring the power dissipated in the current carrying device by measuring the current through the device and calculating the dissipation based upon the resistance of the device where said resistance is adjusted for the temperature of the device or the current through the device;

a digital computer;

means for inputting to the digital computer, the reference temperature value, the power dissipated in the current carrying device, the thermal resistances and thermal time constants of the thermal model simulating the current carrying device to the reference temperature; and means comprising the digital computer for continuously calculating a differential temperature based upon the power dissipation and thermal model and adding the reference temperature thereto.

16. The apparatus according to claim 15 in which the device has a programmable fuse, the thermal model of which makes use of a constant reference temperature and multiple time constants.

17. The apparatus according to claim 15 further comprising means for providing a programmable fuse without the need for measuring a reference temperature.

18. The apparatus according to claim 1 or 15 wherein the calculated temperature is compared to preprogrammed limits that activate cooling action, annunciation, foldback or shutdown.

19. An apparatus for monitoring the temperature of an inaccessible portion of an electrical current carrying device that cannot be directly measured easily comprising:

means for establishing a reference temperature value in the vicinity of the current carrying device;

means for measuring the power dissipated in the current carrying device;

a digital computer;

means for inputting to the digital computer, the reference temperature value, the power dissipated in the current carrying device, the thermal resistances and thermal time constants of the thermal model simulating the current carrying device to the reference temperature; and means comprising the digital computer for continuously calculating a differential temperature based upon the power dissipation and thermal model and adding the reference temperature thereto wherein the differential temperature comprises two components, a positive differential resulting from power dissipation, if any, and a negative differential based upon heat transfer away from the device.

\* \* \* \* \*